US012626884B2

(12) United States Patent
Bosch et al.

(10) Patent No.: US 12,626,884 B2
(45) Date of Patent: May 12, 2026

(54) METHOD AND SCANNING TRANSMISSION CHARGED-PARTICLE MICROSCOPE

(71) Applicant: FEI COMPANY, Hillsboro, OR (US)

(72) Inventors: Eric Bosch, Eindhoven (NL); Ivan Lazic, Eindhoven (NL)

(73) Assignee: FEI COMPANY, Hillsboro, OR (US)

( * ) Notice: Subject to any disclaimer, the term of this patent is extended or adjusted under 35 U.S.C. 154(b) by 385 days.

(21) Appl. No.: 18/303,106

(22) Filed: Apr. 19, 2023

(65) Prior Publication Data

US 2023/0352269 A1     Nov. 2, 2023

(30) Foreign Application Priority Data

Apr. 28, 2022    (EP) ..................................... 22170486

(51) Int. Cl.
| | |
|---|---|
| *G06T 7/571* | (2017.01) |
| *H01J 37/244* | (2006.01) |
| *H01J 37/28* | (2006.01) |

(52) U.S. Cl.
CPC .............. *H01J 37/28* (2013.01); *G06T 7/571* (2017.01); *H01J 37/244* (2013.01); *G06T 2207/10061* (2013.01); *G06T 2207/20056* (2013.01); *H01J 2237/223* (2013.01)

(58) Field of Classification Search
None
See application file for complete search history.

(56) References Cited

U.S. PATENT DOCUMENTS

| | | | | |
|---|---|---|---|---|
| 2016/0307729 A1* | 10/2016 | Lazic | ...................... | H01J 37/28 |
| 2019/0272974 A1* | 9/2019 | Bosch | ................... | H01J 37/244 |
| 2023/0040811 A1* | 2/2023 | Shibata | ................. | H01J 37/265 |

OTHER PUBLICATIONS

Bosch E.G.T., et al., "Analysis of Depth-Sectioning STEM for Thick Samples and 3D Imaging," Ultramicroscopy, Aug. 24, 2019, vol. 207, XP085903186, 22 pages.
Einspahr J.J., et al., "Prospects for 3D, Nanometer-Resolution Imaging by Confocal STEM," Ultramicroscopy, Oct. 1, 2006, vol. 106, No. 11-12, XP027887449, pp. 1041-1052.
(Continued)

*Primary Examiner* — Eliza W Osenbaugh-Stewart
(74) *Attorney, Agent, or Firm* — Michael Best & Friedrich LLP

(57) ABSTRACT

A computer-implemented method of processing image data according to the present disclosure comprises: receiving the image data, wherein the image data is scanning transmission charged-particle microscope (STCPM) image data representing a STCPM scan obtained at a first focus depth; and processing a system of equations expressing the image data as a sum of contributions from a plurality of slices of the sample at a plurality of focus depths, wherein each equation of the system of equations relates at least a portion of the image data to: at least one of a plurality of contrast transfer functions of the STCPM, each contrast transfer function of the STCPM being determined at a different respective focus depth; and at least one set of unknown objects of the STCPM, each unknown object in a set being at a different respective focus depth. The step of processing comprises solving the system of equations to obtain at least one of the plurality of unknown objects of the STCPM.

17 Claims, 5 Drawing Sheets

(56) References Cited

OTHER PUBLICATIONS

EP22170486.9, Extended European Search Report, Nov. 3, 2022, 5 pages.

Lazic, et al., "Chapter 3—Analytical Review of Direct Stem Imaging Techniques for Thin Samples", Advances in Imaging and Electron Physics, Peter W. Hawkes, editor, Burlington, Academic Press, 2017, vol. 199, pp. 75-184.

Niels De Jonge et al., "Three-Dimensional Scanning Transmission Electron Microscopy of Biological Specimens," Microscopy and Microanalysis, Springer, New York, NY, U.S., vol. 16, No. 1, Feb. 2010, pp. 54-63.

* cited by examiner $$1 - \cos \varphi_n$$

METHOD AND SCANNING TRANSMISSION CHARGED-PARTICLE MICROSCOPE

FIELD

This disclosure concerns scanning transmission charged-particle microscopes (STCPMs), methods of processing STCPM image data and computer programs for processing STCPM image data.

BACKGROUND

Charged-particle microscopy, and particular electron microscopy, is a well-known and increasingly important technique for imaging microscopic objects. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM). Moreover, various sub-species have been developed, such as so-called "dual-beam" tools (e.g. a FIB-SEM), which additionally employ a "machining" Focused Ion Beam (FIB), allowing supportive activities such as ion-beam milling or Ion-Beam-Induced Deposition (IBID), for example.

In a SEM, irradiation of a specimen by a scanning electron beam causes emanation of "auxiliary" radiation from the specimen, in the form of secondary electrons, backscattered electrons, X-rays and photoluminescence (infrared, visible and/or ultraviolet photons). One or more components of this emanating radiation is/are then detected and used for image accumulation purposes, and/or spectroscopic analysis (as in the case of EDX (Energy-Dispersive X-Ray Spectroscopy), for example).

In a TEM, an electron beam used to irradiate the specimen is chosen to be of a high-enough energy to penetrate the specimen (which, to this end, will generally be thinner than in the case of a SEM specimen). The flux of transmitted electrons emanating from the specimen can then be used to create an image, or produce a spectrum (as in the case of Electron Energy-Loss Spectroscopy, EELS). If such a TEM is operated in scanning mode (thus becoming a STEM), the image/spectrum in question will be accumulated during a scanning motion of the irradiating electron beam.

As an alternative to the use of electrons as an irradiating beam, charged-particle microscopy can also be performed using other species of charged particle. In this respect, the phrase "charged particle" should be broadly interpreted as encompassing electrons, positive ions (e.g. Ga or He ions), negative ions, protons and positrons, for instance.

In addition to imaging and/or spectroscopy, a charged-particle microscope (CPM) may also have other functionalities, such as examining diffractograms, performing (localized) surface modification (e.g. milling, etching, deposition), etc.

In any case, scanning transmission charged-particle microscopes (STCPMs) usually comprise at least the following components:

A radiation source, such as a Schottky electron source or ion gun.

An illuminator, which manipulates a "raw" radiation beam from the source and performs certain operations on the beam, such as focusing, aberration mitigation, cropping (with a stop/iris/condensing aperture), filtering, etc. An illuminator will generally comprise one or more charged-particle lenses, and may also comprise other types of particle-optical components. If desired, the illuminator can be provided with a deflector system that can be used to cause its output beam to perform a scanning motion across the specimen being investigated.

A specimen holder, on which a specimen under investigation can be held and positioned (e.g. tilted, rotated). If desired, the holder can be moved to effect a scanning motion of the beam with respect to the specimen. In general, such a specimen holder will be connected to a positioning system such as a mechanical stage.

An imaging system, which takes charged particles that are transmitted through a specimen (plane) and directs (focuses) the charged particles onto analysis apparatus, such as a detection/imaging device, spectroscopic apparatus, etc. As with the illuminator, the imaging system may also perform other functions, such as aberration mitigation, cropping, filtering, etc., and it will generally comprise one or more charged-particle lenses and/or other types of particle-optical components.

A detector, which may be unitary or compound/distributed in nature, and which can take many different forms, depending on the radiation/entity being recorded. Such a detector may, for example, be used to register an intensity value, to capture an image, or to record a spectrum. Examples include photomultipliers (including solid-state photomultipliers, SSPMs), photodiodes, (pixelated) CMOS detectors, (pixelated) CCD detectors, photovoltaic cells, etc., which may, for example, be used in conjunction with a scintillator film, for instance. For X-ray detection, use is typically made of a so-called Silicon Drift Detector (SDD), or a Silicon Lithium (Si(Li)) detector, for example. Typically, an STCPM will comprise several detectors, of various types.

EP-3,082,150-B1, which is commonly assigned with the present disclosure and incorporated herein by reference, discloses a method of performing a through-focus series (TFS), that as a result produces a set of depth sections of the sample. TFS STEM imaging is, therefore, an existing method to obtain a 3D image of a thick sample. In order to achieve this, a series of STEM scans are made using a STEM detector at different focus values. The result is a stack of STEM images, which could be of any type (Bright Field—which is termed BF—, Annular Bright Field—which is termed ABF—, (High Angle) Angular Dark Field which is termed (HA)ADF—, (integrated) Differential Phase Contrast which is termed (i)DPC—, (integrated) Center of Mass which is termed (i)COM—, as well as single arbitrary segment (or combination of segments) image). When these images are properly aligned with each other, a 3D reconstruction is formed, which has a z-resolution that is limited by the beam opening (semi-)angle $\alpha$.

Bosch, E. G. T. and Lazić, I., 2019. Analysis of depth-sectioning STEM for thick samples and 3D imaging, *Ultramicroscopy*, 207, p. 112831 showed that the individual images at each focus value can (provided some conditions as set forth in this paper are met) be interpreted as a sum of contributions from different slices of the thick sample. Therefore, there is, in principle, a deconvolution step needed to obtain the information from each slice. In practice, however, the contributions from slices before and after the slice where the beam is focused are typically ignored.

When performing a TFS, if there is sample drift, then the alignment of the stack of images can be problematic, because it can be impossible to determine the difference between a slowly moving stack and a tilted sample. This can give rise to difficulties in reliably identifying structures in 3D. Moreover, performing a TFS requires scans to be made at different focus depths, which can increase the time required to obtain images. Thus, while TFS imaging provides good performance in many respects, it is an object of the present disclosure to address these and other problems with known imaging apparatus and methods.

SUMMARY

Against this background and in accordance with a first aspect, there is provided a method according to claim 1. In accordance with a second aspect, there is provided a scanning transmission charged-particle microscope (STCPM) according to claim 15. A computer program and a computer-readable medium in accordance with claims 16 and 17 are also provided.

Embodiments of the present disclosure allow slices of a relatively thick sample to be obtained from a single STCPM scan. Some embodiments of the disclosure use a segmented STEM detector (in Bright-Field (BF), for example) and the theoretical description of STEM imaging for a thick sample, to construct a linear set of equations for each k-vector of a Fourier transform of the set of segmented STEM images. The solution to these equations can provide a set of images corresponding to the objects sin $\varphi_n$ and $1-\cos \varphi_n$, where $\varphi_n$ are the phase shifts induced by the n-th (thin) slice of the sample. For thin samples, $\varphi(r)$ can be interpreted as the projected electrostatic potential. Thus, from this, a (projected) charge distribution and/or a (projected) internal electrical field can be derived. Accordingly, some embodiments of this disclosure provide valuable insight into the fundamental structure (e.g. the physical and/or electronic structure) of a sample.

Such slices may be useful for performing a 3D reconstruction of a sample from only a single scan. This may be particularly advantageous for samples that are sensitive to doses of radiation. A further advantage of embodiments described herein is that there is no need to compensate for drift of the stage (either in the xy- or in the z-direction) as would be needed for a conventional TFS. Moreover, the reconstructions provided by the present disclosure can provide deconvolution of information from different depths in the sample Additionally or alternatively, the methods described herein may comprise performing a correction for aberrations (e.g. astigmatism) present in the probe.

Throughout this disclosure, embodiments are described by way of example in the specific context of electron microscopy. However, this simplification is intended solely for the illustrative purposes and should not be interpreted as limiting.

LISTING OF FIGURES

Embodiments of the present disclosure may be put into practice in a number of ways and will now be described by way of example only and with reference to the accompanying drawings, in which.

DETAILED DESCRIPTION

Figure 1:
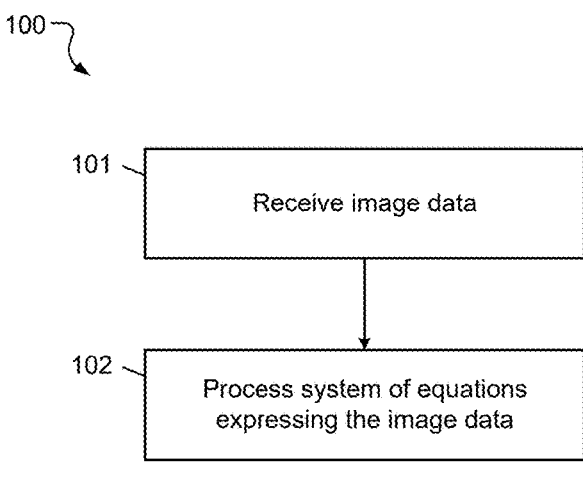
FIG. 1 shows a method in accordance with an embodiment.
Figure 2:
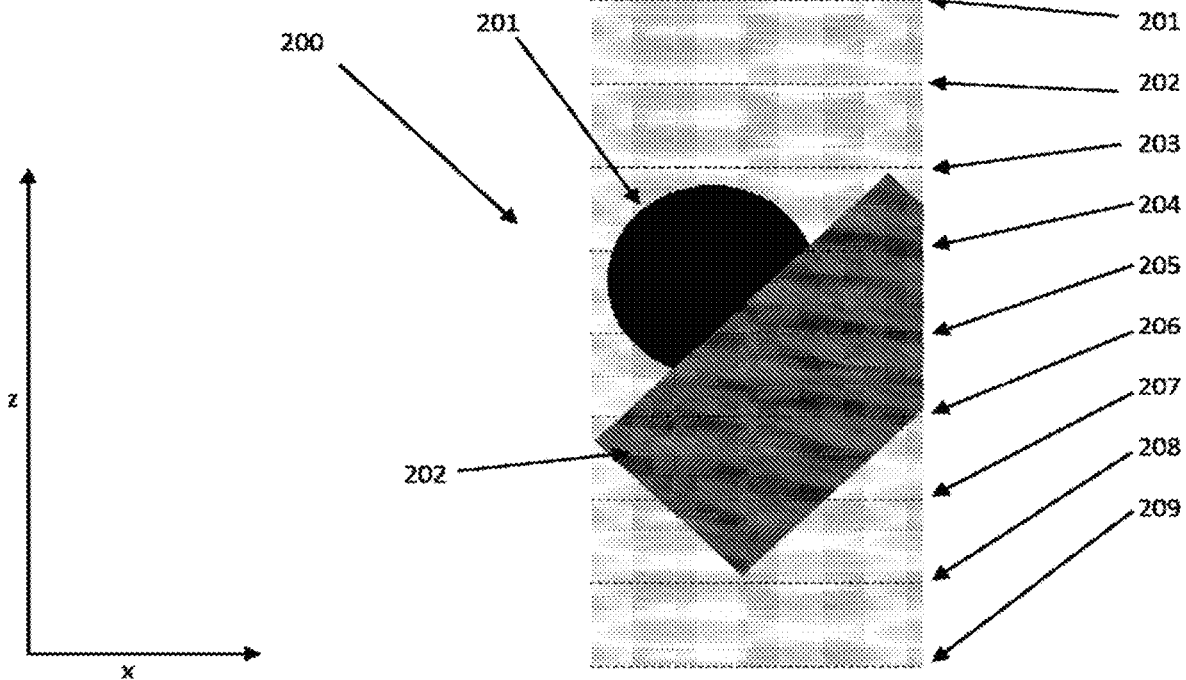
FIG. 2 shows a sample that can be analysed using embodiments of the present disclosure.

In FIG. 1, there is shown a method in accordance with an embodiment of the disclosure. In particular, FIG. 1 shows a method of processing image data. In FIG. 2, there is shown a schematic graphical representation of a sample to which the method of FIG. 1 can be applied.

In this embodiment, the image data is scanning transmission charged-particle microscope (STCPM) image data representing a STCPM scan obtained at a first focus depth. The method comprises a step of receiving 101 the image data. The method further comprises a step of processing 102 a system of equations expressing the image data as a sum of contributions from a plurality of slices of the sample at a plurality of focus depths. The objects of the STCPM are unknown variables in the system of equations. Hence, the objects of the STCPM are described herein as unknown objects. Each equation of the system of equations relates at least a portion of (e.g. a Fourier component of) the image data to at least one of a plurality of contrast transfer functions of the STCPM, each contrast transfer function of the STCPM being determined at a different respective focus depth; and at least one set of unknown objects of the STCPM, each unknown object in a set being at a different respective focus depth. The step of processing comprises solving the system of equations to obtain at least one of the plurality of unknown objects of the STCPM.

FIG. 2 shows a visualisation of how the method of FIG. 1 can be applied to a sample. In FIG. 2, the y-direction extends into the page. FIG. 2 shows a sample 200 that is thick in the z-direction and the sample 200 comprises a roughly spherical particle 201 on top of a substrate 202. The particle 201 is of similar thickness to the particle 201 and is tilted at 45 degrees relative to the x-axis.

The methods of the disclosure can obtain information about the sample at a plurality of distinct theoretical focus depths 201-209. Each focus depth 201-209 represents a theoretical slice that is thin in the z-direction and that extends in the x- and y-directions.

When the sample 200 is placed in a STCPM, charged particles pass through the sample 200 in the z-direction and the charged particles interact continuously with the sample 200. Interactions with the sample 200 cause absorption and/or scattering of the charged particles, which affects the image that is formed in the STCPM. In the methods of the present disclosure, the sample may be scanned in the x-y plane and a scan at a particular focus depth in the z-direction may be performed. Under certain conditions, as will be discussed in greater detail below, the resultant image formed by charged particles that pass through the sample 200 can be expressed as a sum of contributions from each of the slices 201-209 at their respective focus depths.

It is important to note that not all of the slices 201-209 pass through the substrate or the spherical particle. For example, the focus depths of slices 201, 202, 203, 208 and 209 are outside the substrate and the spherical particle. Nevertheless, when performing the methods disclosed herein, it is possible to represent the image data of the STCPM mathematically as a sum of contributions from slices at various different depths that are both within the sample and outside the sample. The fact that some theoretical slices relate to contributions from outside the sample does not detract from the validity of the solutions that can be obtained. The implications of some of the slices being outside the sample 200 are discussed in more detail with reference to FIGS. 3A and 3B.

By expressing the image data as a sum of contributions from a plurality of slices of the sample at a plurality of focus depths, objects corresponding to slices at various depths within the sample (which may be chosen by a user, or which may be determined automatically) can be obtained from a single STCPM scan obtained at a single focus depth. The slices described in this disclosure are mathematical constructs that represent virtual slices of the sample. It is important to note that embodiments of this disclosure do not require a sample to be physically divided into distinct slices (e.g. by milling). The virtual slices in this disclosure may be virtual slices corresponding to particular focus depths at respective z-values (which are spaced apart by a chosen distance, which may be user-defined). The STCPM image data described herein is real image data obtained at a first focus depth. The focus depths of the virtual slices of the sample do not need to include (although they may include) the first focus depth used to obtain the STCPM image data.

Preferably, the step of processing comprises solving the system of equations to obtain a plurality of unknown objects of the STCPM at different focus depths (i.e. theoretical focus depths of the virtual slices that are not necessarily the same as the experimental focus depth). Hence, a TFS of images (i.e. a plurality of images at different focus depths) can be obtained from a single scan at a single focus depth. This can reduce the number of scans needed to obtain data from different z-positions, e.g., focus depths, in the sample, when compared with existing TFS methods. Nevertheless, in some implementations, it may be advantageous to solve the system of equations to obtain only a single unknown object of the STCPM at a certain depth, without obtaining objects at other different depths.

As explained in further detail below, the objects of STEM imaging are $\sin \varphi_n(r_p)$ and $1-\cos \varphi_n(r_p)$. Each of these objects can be used to glean valuable insight into the structure of a material. In particular, these two objects can be used to form the expression $e^{i\varphi_n}$ and then $\varphi_n$ can be obtained by taking the argument. In some cases, forming $e^{i\varphi_n}$ may require additional processing, because all of the CTFs for the $\sin \varphi_n(r_p)$ may be zero at frequency zero (DC), and the DC component may not be fixed. In such cases, the DC level may be fixed by looking at the modus of the histogram of $\sin \varphi_n(r_p)$ and next assuming that that level corresponds to zero. When part of the scan contains vacuum, there is a second option: the reconstructed value in the part of the image that contains vacuum may be set to zero.

In the embodiment of FIG. 1, it is preferred that one of the sets of unknown objects comprises $\sin \varphi_n(r_p)$ and/or one of the sets of unknown objects that is obtained comprises $1-\cos \varphi_n(r_p)$, where $r_p$ represents a scan position of the image data and $\varphi_n$ represents a phase shift induced by an n-th slice of the plurality of slices of the sample. That is, as charged particles pass through a sample comprising a plurality of thin slices, their phase will be altered and $\varphi_n$ represents a phase shift caused by the n-th thin slice. In embodiments of this disclosure, a set of objects (e.g. a plurality of objects at different depths) is preferably obtained by iterating through n. For example, in some embodiments, the step of processing may comprise solving the system of equations to obtain each unknown object of at least one of the sets of unknown objects (and this may be performed to obtain each object of each set). Nevertheless, information about a single slice is still useful information and so it is possible simply to obtain $\sin \varphi_n(r_p)$ and/or $1-\cos \varphi_n(r_p)$ for a single value of n. Stated differently, a set of unknown objects may comprise one or a plurality of unknown objects.

As will be explained in further detail below, the system of equations may relate the components of a Fourier transform of the image data to the at least one (and preferably each) of a plurality of contrast transfer functions and to the components of a Fourier transform of at least one (and preferably each) of the plurality of unknown objects of the STCPM. Such systems of equations can readily be solved using numerical methods to obtain one or a plurality of unknown objects of the STCPM from acquired image data and calculated contrast transfer functions. The plurality of contrast transfer functions may comprise a first plurality of contrast functions associated with a first object of the STCPM imaging (e.g. a $\sin \varphi(r)$ object) and a second plurality of contrast functions associated with a first object of the STCPM imaging (e.g. a $1-\cos \varphi(r)$ object).

The theoretical background to the embodiment of FIG. 1 will not be explained in more detail. Embodiments of this disclosure build upon the theory for STEM imaging of thick samples described in Bosch, E. G. T. and Lazić, I., 2019. Analysis of depth-sectioning STEM for thick samples and 3D imaging. *Ultramicroscopy*, 207, p. 112831. In particular, under certain conditions, the STEM image for a thick sample from one segment of a segmented STEM detector can be expressed as:

$$I_s^{STEM}(r_p, z_p) = \sum_n I_{s,n}^{STEM}(r_p, z_p, z_n),$$

where s indicates the segment number and $$I_{s,n}^{STEM}(r_p, z_p, z_n)$$

is a contribution from a thin slice at z-position $z_n$. The scan position is given by the coordinates $r_p$ and defocus is used to focus the probe at z-position $z_p$. Hence, the image data may be expressed as a sum of contributions from a plurality of slices of the sample at a plurality of focus depths.

This approximation is most accurate when conditions relating to linearity, an undisturbed probe and elastic scattering are fulfilled. These conditions are collectively termed the 'undisturbed probe model' in Bosch, E. G. T. and Lazić, I., 2019. Analysis of depth-sectioning STEM for thick samples and 3D imaging. *Ultramicroscopy*, 207, p.112831. The full details of the undisturbed model are elucidated in further detail therein, but the following assumptions apply:

(i) different layers of the sample (from every position z) contribute equally, independently (incoherently) and linearly to the convergent beam electron diffraction (CBED) pattern at the detector plane and therefore to the STEM image obtained for a given depth position of the probe. The final CBED pattern for a given probe position, as well as the 2D STEM image obtained for a given focus position of the probe is then just the sum of contributions from every slice of the sample. A full 3D image of the sample is formed by the set of 2D images at every focus position of the probe.

(ii) The contribution from each slice of the sample can be computed by assuming that the part of the sample above and below the slice does not exist. In other words, the probe focused at a certain depth with respect to the sample is not affected by the sample as it passes through. The input wave at a given slice is, therefore, the undisturbed 2D input at the current sample depth. It picks up only the phase information from the current slice at that position and further on is not affected by the rest of the sample. Combining this with assumption (i) this means that the 3D probe only changes its relative position with respect to the sample, but it stays undisturbed during the 3D scanning process, effectively forming a 3D cross correlation.

(iii) Inelastic scattering, such as excitation of plasmons and/or core shell ionization events can be ignored.

It has been shown that for amorphous materials comprising light elements, the above three approximations are valid for reasonable sample thickness (for example, at least up to 30 nm). Even if the above assumptions are not entirely valid, useful information can be obtained. In general, there may be a limit above which the assumptions cease to hold and the resultant data becomes less quantitative, but this limit will be 1) dependent on the type of material (e.g. whether light/ heavy elements are present) and 2) the same kind of limitation that is also present with STEM imaging in general. Thus, in embodiments of the present disclosure, the sample may have a thickness of up to 10 nm, up to 20 nm, or up to 30 nm, but greater sample thicknesses may be used while still extracting useful information.

Using the linearity of the Fourier transform, the above expression for $$I_s^{STEM}(r_p, z_p)$$

can also be expressed as:

$$\mathcal{F}_{r_p}\{I_s^{STEM}(r_p, z_p)\}(k_p) = \sum_n \mathcal{F}_{r_p}\{I_{s,n}^{STEM}(r_p, z_p, z_n)\}(k_p),$$

with $$\mathcal{F}_{r_p}\{I_{s,n}^{STEM}(r_p, z_p, z_n)\}(k_p) =$$

$$CTF_{S,n}(k_p, z_p) \cdot \mathcal{F}\{\sin \varphi_n(r_p)\}(k_p) + CTF_{C,s,n}(k_p, z_p) \cdot \mathcal{F}\{1 - \cos \varphi_n(r_p)\}(k_p)$$

where $CTF_S$ and $CTF_C$ are the contrast transfer functions (CTF) for the objects of the STEM imaging, which are $\sin \varphi_n(r_p)$ and $1 - \cos \varphi_n(r_p)$, respectively. For thin samples, $\varphi(r)$ can be interpreted as the projected electrostatic potential. From this a (projected) charge distribution and/or a (projected) internal electrical field can be derived, as proven and explained in several papers: Lazić I, Bosch E G T, Lazar S, Ultramicroscopy, 2016; 160:265-280; Lazić I, Bosch E G T, Advances in Imaging and Electron Physics, 2017; 199:75-184 and Bosch, E. G. T., Lazić, I., 2019. Analysis of depth-sectioning STEM for thick samples and 3D imaging. Ultramicroscopy 207, 112831.

The CTFs depend on the shape of the segment, given by the window function $W_s(k)$, and on the probe, $\psi_{in,n}(r_p, z_p)$. Full expressions and the theoretical background for these CTFs can be found in Bosch, E. G. T. and Lazić, I., 2019. Analysis of depth-sectioning STEM for thick samples and 3D imaging. *Ultramicroscopy*, 207, p. 112831. In particular, it is shown in Appendix A thereof that $$CTF_S(k_p, W(k)) \equiv -i \cdot \left( \overline{\mathcal{F}\left(\psi_{in}(r) \cdot \mathcal{F}\left(W(k)\mathcal{F}^{-1}\overline{\{\psi_{in}(r')\}}(k)\right)(r)\right)}(k_p) + \right.$$

$$\left. -\overline{\mathcal{F}\{\overline{\psi_{in}(r)}\} \cdot \mathcal{F}^{-1}\{W(k)\mathcal{F}\{\psi_{in}(r')\}(k)\}(r)}(k_p) \right)$$

and $$CTF_C(k_p, W(k)) = CTF_{C1}(k_p, W(k)) + CTF_{C2}(k_p, W(k))$$

with $$CTF_{C1}(k_p, W(k)) = -1 \cdot \left( \overline{\mathcal{F}\{\psi_{in}(r) \cdot \mathcal{F}\left(W(k)\mathcal{F}^{-1}\overline{\{\psi_{in}(r')\}}(k)\right)(r)\}}(k_p) + \right.$$

$$\left. \overline{\mathcal{F}\{\overline{\psi_{in}(r)}\} \cdot \mathcal{F}^{-1}\{W(k)\mathcal{F}\{\psi_{in}(r')\}(k)\}(r)}(k_p) \right)$$

$$CTF_{C2}(k_p, W(k)) = 2C(\tilde{R}_N, W) \cdot \overline{\mathcal{F}\{|\psi_{in}(r)|^2\}}(k_p).$$

The term $C(\tilde{R}_N, W)$ is a constant (i.e. not a function of $k_p$), and is a functional depending on the detector function $W(k)$ and the probe $\psi_{in}(r)$ and the sample $\varphi(r)$ via $\tilde{R}_N$, which can be very accurately approximated in several ways, as explained in, for example, section 3.1 of I. Lazić, E. G. T. Bosch, Analytical review of direct stem imaging techniques for thin samples, Advances in Imaging and Electron Physics, 199 Elsevier, 2017, pp. 75-184. In particular, section 3.1 of I. Lazić, E. G. T. Bosch, Analytical review of direct stem imaging techniques for thin samples, Advances in Imaging and Electron Physics, 199 Elsevier, 2017, pp. 75-184, is incorporated herein by reference and shows ways of approximating the general form of $C(\tilde{R}_N, W)$ is shown below:

$$C(\tilde{R}_N, W) = \int\int_{-\infty}^{\infty} \tilde{R}_N(r')\mathcal{F}\{W(k)\}(r')d^2r'$$

In certain embodiments of this disclosure, analysis is performed on segments that are all fully in BF, so the $CTF_C$ term provided above can be approximated by using only the $CTF_{C1}$ (for the reasons explained in Bosch, E. G. T. and Lazić, I., 2019. Analysis of depth-sectioning STEM for thick samples and 3D imaging. *Ultramicroscopy*, 207, p. 112831). Nevertheless, this approximation is not necessary in all embodiments of the disclosure and some embodiments of the disclosure can be used for segments that are not fully in BF. For example, it may be possible under certain circumstances to provide a theoretical description of the CTF for a general DF segment and in such a case, the methods described herein may be applied.

Embodiments of the present disclosure recognise that if there are M segments in the segmented detector and it is desired to describe the sample by N slices corresponding to 2N objects (N times $\sin \varphi_n$ object and N times the $1 - \cos \varphi_n$ object), then the above expression for $$\mathcal{F}_{r_p}\{I_s^{STEM}(r_p, z_p)\}(k_p)$$

can be used. Specifically, for every wave vector $k_p$, a system of M equations with 2N unknowns can be established and represented as a matrix problem of the form $A\underline{u}=\underline{v}$, where A is a matrix representing the plurality of contrast transfer functions of the STCPM, $\underline{u}$ is a vector representing the at least one set of unknown objects of the STCPM (e.g. a Fourier transform thereof), and $\underline{v}$ is a vector representing the image data (e.g. a Fourier transform thereof). In particular, the system of equations may be given by:

$$\begin{pmatrix} CTF_{S,0,0} & CTF_{C,0,0} & CTF_{S,0,1} & CTF_{C,0,1} & \cdots & CTF_{S,0,N} & CTF_{C,0,N} \\ CTF_{S,1,0} & CTF_{C,1,0} & CTF_{S,1,1} & CTF_{C,1,1} & \cdots & CTF_{S,1,N} & CTF_{C,1,N} \\ \vdots & \vdots & \vdots & \vdots & \ddots & \vdots & \vdots \\ CTF_{S,M,0} & CTF_{C,M,0} & CTF_{S,M,1} & CTF_{C,M,1} & \cdots & CTF_{S,M,N} & CTF_{C,M,N} \end{pmatrix}$$

$$\begin{pmatrix} \mathcal{F}\{\sin\varphi_0\} \\ \mathcal{F}\{1-\cos\varphi_0\} \\ \mathcal{F}\{\sin\varphi_1\} \\ \mathcal{F}\{1-\cos\varphi_1\} \\ \vdots \\ \mathcal{F}\{\sin\varphi_N\} \\ \mathcal{F}\{1-\cos\varphi_N\} \end{pmatrix} = \begin{pmatrix} \mathcal{F}\{I_0^{STEM}\} \\ \mathcal{F}\{I_1^{STEM}\} \\ \vdots \\ \mathcal{F}\{I_M^{STEM}\} \end{pmatrix}$$

where: $CTF_{S/C,M,N}$ are contrast transfer functions of the STCPM for the objects $\sin \varphi_n(r_p)$ and $1-\cos \varphi_n(r_p)$ respectively, where $r_p$ represents a scan position of the image data; the plurality of slices comprises N slices; the image data is segmented STCPM image data from a STCPM detector having M segments; $\mathcal{F} \{\sin \varphi_n\}$ and $\mathcal{F} \{1-\cos \varphi_n\}$ for n=0, 1, . . . , N are components of Fourier transforms of the objects $\sin \varphi_n(r_p)$ and $1-\cos \varphi_n(r_p)$; and $$\mathcal{F}\{I_s^{STEM}\},$$

for s=0, 1, . . . , M, are components of Fourier transforms of the image data.

It should be noted that the above system of equations could be expressed in a different form. For instance, it will be apparent that the equations could be rearranged such that the $\sin \varphi_n$ terms are grouped together first and the $1-\cos \varphi_n(r_p)$ terms next. This would amount to simply re-ordering the terms in the systems of equations, which would not alter the solution to the equations (i.e. the unknown objects). Moreover, for example, the vector of unknown objects $\underline{u}$ could be obtained directly without representing the system of equations in the form shown above, for example by solving $\underline{u}=A^{-1}\underline{v}$, where $A^{-1}$ is a (pseudo)inverse of A. Additionally, the individual inverse Fourier transforms could be calculated in the same step if desired.

Regardless of how the system of equations is expressed, embodiments of the present disclosure utilise the fact that the system of equations can be solved to obtain the unknown Fourier component of the objects. An example method uses singular value decomposition (SVD). That is, in some embodiments, a step of processing the system of equations may comprise solving the system of equations by singular value decomposition (SVD).

The number of independent slices that can be reconstructed may be limited by the number of segments, so embodiments of the disclosure work most effectively when N<<M/2. Therefore, when N slices are sought and the image data is segmented STCPM image data from a STCPM detector having M segments, N is preferably chosen such that N and M together satisfy at least one of: N<<0.5 M; N<0.5 M; N<0.4 M; N<0.3 M; N<0.2 M; N<0.1 M; N<0.05M; and N<0.01M.

By solving the above set of equations for every single wave vector $k_p$, the complete Fourier transform of the various objects can be formed. Hence, in a general sense, embodiments of the disclosure comprise obtaining components of Fourier transforms of at least one of the plurality of unknown objects of the STCPM and obtaining the at least one of the plurality of unknown objects of the STCPM by inverse Fourier transformation. Thus, embodiments of the disclosure allow a set of slices from a thick sample to be generated without actually performing a through-focus series. A Fast Fourier Transform algorithm is suitable and efficient for this purpose and various methods for calculating a Discrete Fourier Transform can be used (e.g. any of the Cooley-Tukey algorithm, Prime-factor FFT algorithm, Bruun's FFT algorithm, Rader's FFT algorithm, Bluestein's FFT algorithm, and hexagonal fast Fourier transform). The methods described herein may comprise solving the system of equations for each of a plurality of k-vectors of a Fourier transform of the image data.

In some embodiments, k-vectors above and/or below a certain value may be disregarded when processing the data. For example, in some embodiments, there may be a maximum k-vector that is used. In general, there may be no reconstruction beyond a wavevector that has twice the size of the radius of the BF disk, because all CTFs are zero from that point on. Thus, this may be used to set an upper bound on k-vectors. In practice, it may be preferable to stop slightly below the value 2 $k_{BF}$. For example, values of approximately 1.8 $k_{BF}$ may be used as a cut-off value.

The above system of equations is not, in general, well-conditioned, and the 2N×M matrix will become ill-conditioned if the focus values for each of the slices are chosen too close to each other. In the limit of using equal defocus values, there will be two sets of two redundant column vectors in the matrix. By virtue of the properties of SVD, this will result in identical solutions for both "slices", i.e. no new independent information can be obtained from those "slices". Similarly, from a physical point of view, it can be reasoned that if two point detectors are extremely close to each other, then the resulting images will not differ significantly, thereby rendering the system of equations ill-conditioned. Thus, proper separation between the slices ensures that independent information is obtained from the different segment images. If slices are chosen too close together, then there will be redundant information in the images. In practice, applying focus steps that correspond to the theoretical beam waist length (depth of focus) is likely to yield enough independence of the columns in the matrix to obtain useful results. In particular, the theoretical z-resolution of TFS-STEM is given by $$\frac{2\lambda}{\alpha^2}$$

where λ is the relativistically corrected wavelength of the electron, so attempting to obtain slices that are significantly closer together than this value may not always produce slices that contain independent information. Nevertheless, in some cases, slices that are significantly closer together than this value may be capable of yielding slices that contain independent information.

Thus, in some embodiments, the slices may be at least half the depth of view $$(\text{i.e. } \frac{\lambda}{\alpha^2})$$

apart. Various distances between slices can be used, such as: greater than or equal to $$\frac{\lambda}{\alpha^2}; \text{or} \frac{2\lambda}{\alpha^2}; \text{or} \frac{4\lambda}{\alpha^2}; \text{or} \frac{6\lambda}{\alpha^2}; \text{or} \frac{8\lambda}{\alpha^2};$$

and/or less than or equal to:

$$\frac{10\lambda}{\alpha^2}; \text{or} \frac{8\lambda}{\alpha^2}; \text{or} \frac{6\lambda}{\alpha^2}; \text{or} \frac{4\lambda}{\alpha^2}; \text{or} \frac{2\lambda}{\alpha^2}.$$

In embodiments of the disclosure, charged particle energies of, for example, from 1 keV to 300 keV, may be used, and equivalent values of $\lambda$ can be calculated accordingly. Nevertheless, lower and higher energies (and corresponding wavelengths) can also be employed.

The potentially ill-conditioned nature of the systems of equations described herein is one reason why singular value decomposition is advantageous for solving the systems of equations. In particular, SVD yields a solution (albeit containing redundant images) even if slices are chosen too close together. This may be achieved by replacing singular values that are smaller than a certain criterion with zero in the pseudo inverse matrix. Thus, SVD is a preferred method for solving the systems of equations. Nevertheless, it is possible to use other methods for solving the systems of equations described herein. For instance, in cases where the matrix A is full column rank, the Moore-Penrose inverse may be used (as explained at en.wikipedia.org/wiki/Moore%E2%80%93Penrose_inverse#Construction, which is incorporated herein by reference).

The matrices that are used in some embodiments of the disclosure may not be square in general. Non-square matrices do not actually have an inverse, but pseudo inverses can be used to solve non-square systems of equations. In computing the pseudo inverse with SVD, the matrix may be written as A=U S V*, where S is a diagonal (in general non-square) matrix with positive definite singular values along its diagonal and U and V are (square) unitary matrices. In computing the pseudo inverse of A, the pseudo-inverse of S may be formed by taking the reciprocal values of all non-zero singular values. For singular values that are equal to zero, a value of zero is inserted. In practice, it may be advantageous to replace not only zero singular values, but also singular values that are sufficiently close to zero, i.e. which are smaller than a certain value. This can be done in several ways. One way is to replace them by 1/(s+eps) where s is the singular value and eps is a small positive number, which is known as Tikhonov regularisation. In some cases, replacing small singular values with zero yields better results than Tikhonov regularisation, but either approach can be used in embodiments of this disclosure.

In addition to avoiding partitioning the sample into too many slices, it can be advantageous to ensure that there are at least a certain number of slices (e.g. N≥2, N≥3, N≥4, N≥5, N≥6, N≥10, N≥20 etc.) in the reconstruction. In some cases, if there are not enough slices in the reconstruction, then the values for sin $\varphi(r)$ and 1−cos $\varphi(r)$ may not be restricted to the range [−1, +1] and [0, +2], respectively, which is mathematically problematic. Thus, one can use the values produced by a particular number of slices to help determine how many slices should be used. For example, the methods described herein may further comprise: establishing a system of equations (e.g. of the form described previously) based on a first number of slices; assessing a solution to the system of equations for the first number of slices (e.g. determining whether the objects are physically realistic and/or mathematically sensible); and based on the assessment, establishing a new system of equations based on a second number of slices. Assessing a solution to the system of equations for the first number of slices may involve analysing the solution to the systems of equations for the first number of slices to determine whether that solution is viable. For example, if it is determined that the system of equations leads to physically unrealistic solutions, then the number of slices may be increased and a new system of equations may be established based on the increased number of slices. That is, the second number of slices may be greater than the first number of slices. Such methods can improve data extraction in embodiments of this disclosure.

In solving the systems of equations described herein, regularization techniques may be used (for example, before actually solving the systems of equations) to improve the results and/or to improve the likelihood of obtaining a solution that is mathematically or physically valid. For example, when solving the equations using SVD, reciprocals of small singular values may be replaced with zero prior to actually solving the systems of equations. This can reduce the disproportionate impact that such singular values can have on the resulting solution. In some embodiments, small singular values may be determined by comparing singular values with the largest one found and setting a cut-off value below which the inverse of the singular value is set to zero. This cut-off value may somewhere in the range 0.1-0.001 of the largest singular value. The exact value of the cut-off may depend on the noisiness of the data. Setting too small a value for the cut-off may produce undesired (unphysical) artefacts in the reconstruction. Alternatively, as discussed previously, a Tikhonov regularisation of the system of equations may be performed. Thus, in certain embodiments of the disclosure, regularising the system of equations before solving the system of equations may comprise replacing reciprocals of small singular values (e.g. those that are below a threshold value) with zero and/or performing a Tikhonov regularisation of the system of equations.

Figure 3A:
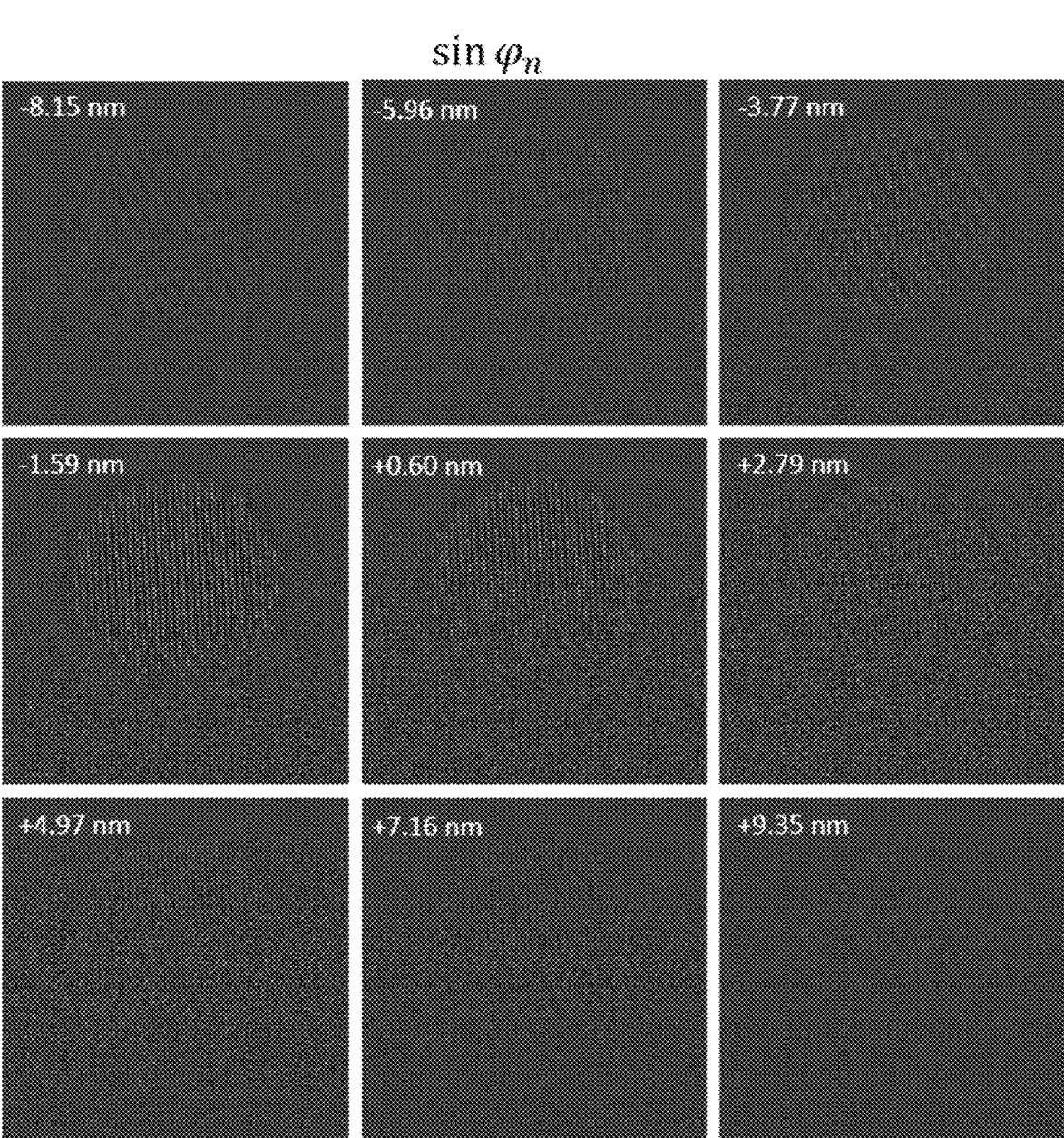
FIGS. 3A and 3B shows experimental STEM data obtained using an embodiment of the present disclosure.
Figure 3B:
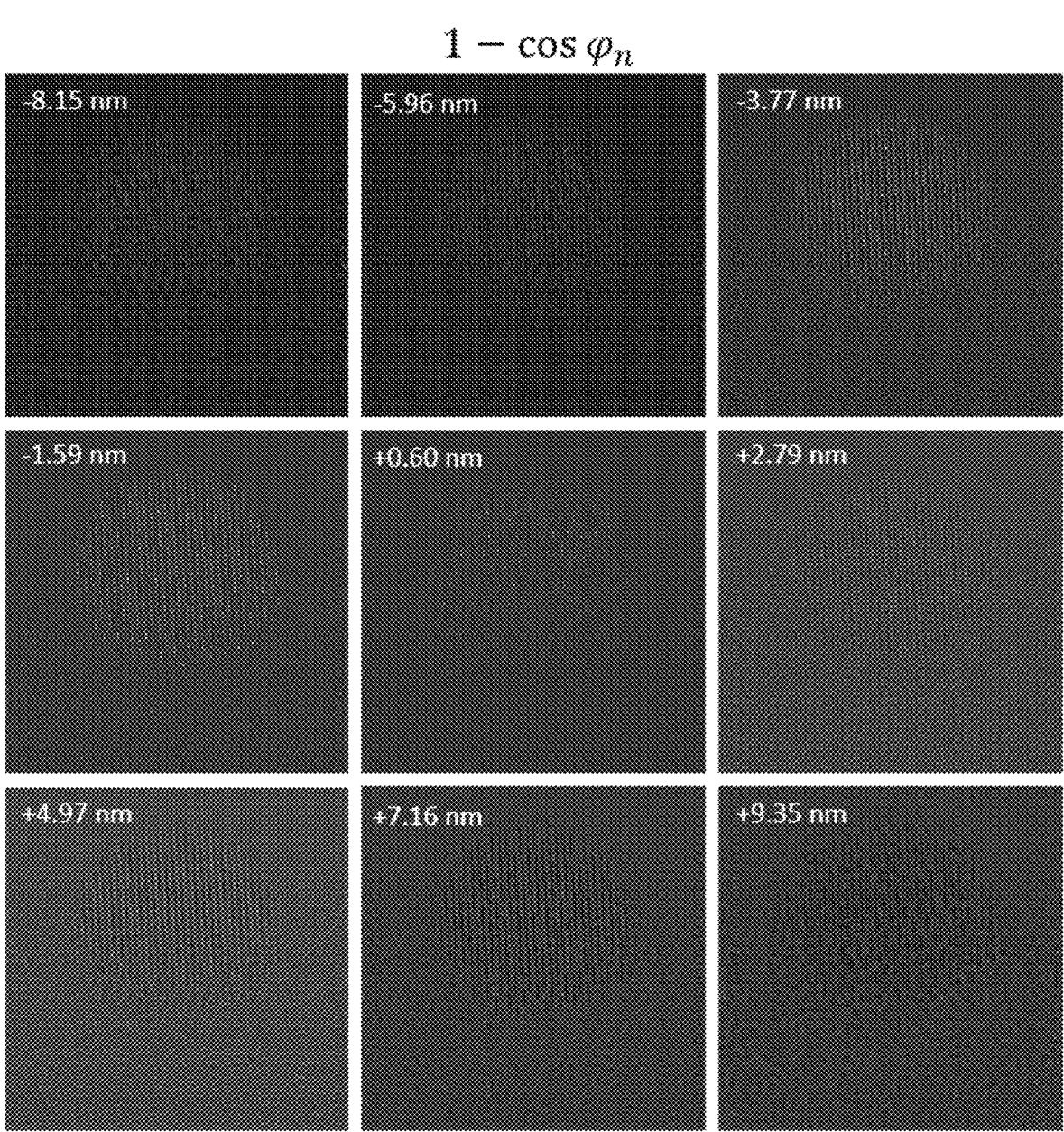
Figure 4:
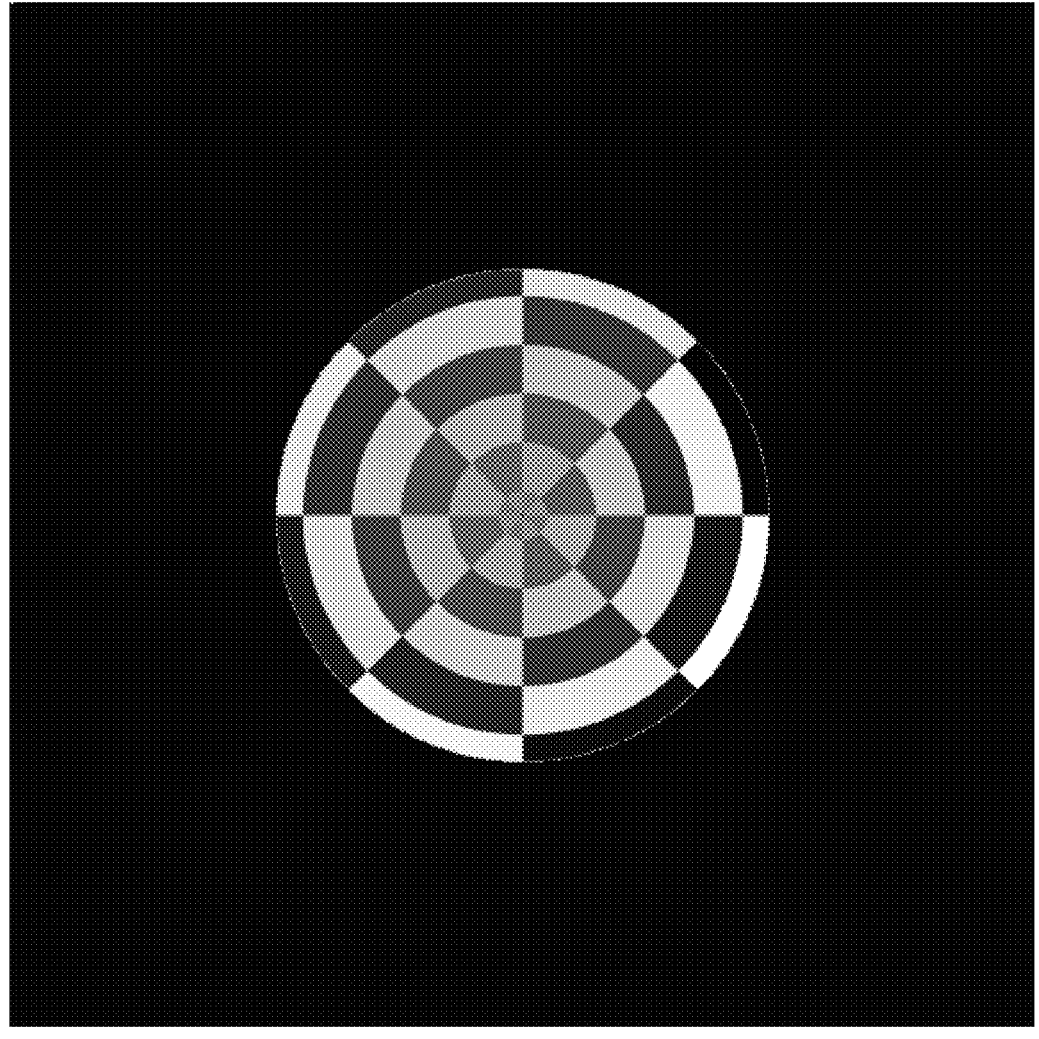
FIG. 4 shows schematically a detector suitable for providing data for use in embodiments of the present disclosure.

Turning next to FIGS. 3A and 3B, there are shown the results of applying an embodiment of the disclosure to a set of simulated STEM segment images obtained from an artificial 48 segment detector comprising 6 rings of 8 segments each, shown in FIG. 4. FIGS. 3A and 3B show a sequence of 9 reconstructed slices for the sin $\varphi_n$ and 1−cos $\varphi_n$ objects, obtained from a single STEM scan using the 48 segments, all located in the bright field (BF). The focus positions of the virtual slices that are obtained by the methods of this disclosure are at z=−8.15, −5.96, −3.77, −1.59, +0.60, +2.79, +4.97, +7.16, and +9.35 nm, where the z-axis is directed into the sample (i.e. along the particle-optical axis, or perpendicular to a plane of the sample) and z=0 nm corresponds to the actual focus plane of the single STEM scan that was performed. This simulated data has a horizontal field width of 8 nm, a beam energy of 300 keV and a beam opening angle of 30 mrad. Notably, the focus depths of the virtual slices do not coincide with the focus depth of the STEM scan, which highlights the advantageous way in which the invention allows valuable information about various depths in the sample to be obtained from a single STEM scan at a single focus depth.

The sample comprises a ~5 nm sized $CeO_2$ particle on top of a 5 nm thick amorphous carbon substrate, which is tilted around the x-axis over 45 degrees, which corresponds to the schematic arrangement shown in FIG. 2. The focus values in the reconstruction are changed with a step size of 2.19 nm, corresponding to half the theoretical depth of focus, which is $$\frac{2\lambda}{\alpha^2} = 4.37$$

nm for a given opening angle and beam energy. The sequence is started at −8.15 nm defocus, which focuses above the sample, which extends between z=−3.4 nm and z=+7.0 nm.

In the first two images at focus −8.15 and −5.96 nm the focus as well as the entire depth of focus lies above the top of the $CeO_2$ particle and the substrate. For the next three slices the focus is either within the depth of focus from or entirely inside the $CeO_2$ particle near the centre of the image as well as part of the carbon substrate at the bottom of the image. The next three images, starting at +2.79 nm have their focus either in or within the depth of focus from the carbon substrate, which extends furthest near the centre of the image. The last image again focuses completely in the vacuum below the sample.

Thus, it can be seen that from a single STEM scan, it is possible to construct at least 6 independent slices at different depths in the sample using embodiments of the present disclosure. This would otherwise have required at least 6 actual TFS scans.

The data obtained using the methods described herein may be useful for many purposes. For instance, the images in FIGS. 3A and 3B allow for visualisation of the structure of a sample. Moreover, for thin samples, φ(r) can be interpreted as the projected electrostatic potential. Thus, from this, a (projected) charge distribution and/or a (projected) internal electrical field can be determined. Accordingly, in general terms, in some embodiments of the present disclosure, the step of processing comprises determining, from the unknown objects of the STCPM, an electrostatic potential, an electric field, and/or a charge distribution of the sample.

In addition to the above-described embodiments, the present disclosure can be used in other ways. For example, if aberration coefficients of the probe producing the set of CTFs in the above systems of equations are not known, the aberration coefficients can be varied within the parameter space and determined such that the sharpest (or at least sharper) final images of the objects are produced. For instance, the methods described herein may comprise determining parameters (aberration coefficients) of the illumination contributing to CTFs in the matrix A. These may not be known but may be determined by varying them in such a way that the sharpest unknown objects are obtained. The resulting set of parameters provide the applied illumination. Sharpness is one criterion that could be used for optimising the obtained unknown objects, but other quality criteria could be used. For example, the parameters of the CTFs could be optimised with respect to contrast or signal-to-noise ratio. The aberration coefficients are the aberration coefficients for the probe. The CTFs depend on the detector function W(k) and the probe $\varphi_{in}(r)$. The probe depends on, in addition to the charged-particle wavelength and the opening angle, the aberration function, which can be described with a series expansion where the coefficients are termed aberration coefficients.

Moreover, it will be understood that an optimisation procedure does not necessarily need to obtain a maximal value of a quality criterion. For example, a unique maximal value may not exist and/or the optimisation procedure may converge on a local maximal value that is not a global maximal value. Hence, the optimisation procedure may simply serve to improve or refine the unknown objects with respect to a quality criterion. Hence, in general terms, the methods described herein may comprise determining one or more parameters of at least one of the plurality of contrast transfer functions of the STCPM by performing an optimisation procedure (which could also be described as an improvement/refinement procedure), with respect to a quality criterion (e.g. sharpness, noise level, or contrast), on at least one (and optionally a plurality or each) of the plurality of unknown objects of the STCPM.

An advantage of the methods described herein is that the reconstructed slices are, in principle, no longer convolved with information from slices above and below, in contrast to the situation for normal TFS-STEM. Nevertheless, in FIGS. 3A and 3B, the $CeO_2$ particle stays faintly visible throughout the whole stack of images. This indicates that there is some cross-talk between different slices at least in the low spatial frequencies (i.e. for large structures). Note that the above theoretical description of a STEM image relies on assumptions (i), (ii) and (iii) discussed above, which do not hold for crystalline samples near a zone axis (i.e. in case of channeling) or for samples that are too thick (e.g. samples for which assumption (ii) breaks down, which may depend on the type of atoms (e.g. light/heavy) present). In particular, the first condition is not met within the $CeO_2$ crystal, which may lead to the observed cross-talk. While the sample in this example is not in a zone axis, it may still be near enough a zone axis for some channelling to be observed. It is possible to determine whether a crystalline sample is near a zone axis (and hence whether the assumptions hold) by visually assessing a diffraction pattern. Within a tomography data set, for example, ADF-STEM images that happen to be in the zone axis are considerably brighter than the rest and can be easily excluded from analysis if needed.

Turning next to FIG. 4, there is shown a detector that can be used in embodiments of this disclosure. The detector is a 48-segment STEM detector. The analytical methods of the present disclosure are generally applicable to detectors having any number of segments. Nevertheless, it is generally desirable for the detector to have as many segments as possible, because a large number of segments allows a correspondingly large number of slices to be obtained. Thus, a 48-segment detector as shown in FIG. 4 is advantageous in the context of this disclosure. However, detectors having fewer segments can be used. For instance, a pixelated detector (e.g. an electron microscope pixel array detector or EMPAD) or camera can be used. A Thermo Scientific™ Panther STEM Detector may also be used if all 12 segments are acquired and stored simultaneously, which could allow up to 6 slices to be obtained. In general terms, it is preferable for the image data to be segmented STCPM image data. For instance, the image data may represent at least 4, 8, 12, 20, 30, 40, 48, 50, or 100 segments. In general, the higher the number of segments, the more information that is obtained and the higher the number of independent slices that can be analysed. In principle, there is no upper limit to the number of segments that can be used, although at a certain point, measurements may become noise-limited (e.g. due to shot noise from the source and detector noise from electronics).

Although the information from a layer that is far out of focus contributes to the segmented STEM images, the information from such a slice will be very blurred and will therefore not have the same resolution as slices closer to the beam focus. Therefore, the methods disclosed herein perform best for defocus values of a few times the beam waist length (depth of focus). As mentioned previously, focus depths of the plurality of slices preferably differ by a distance of: greater than or equal to $$\frac{\lambda}{\alpha^2}; \text{ or } \frac{2\lambda}{\alpha^2}; \text{ or } \frac{4\lambda}{\alpha^2}; \text{ or } \frac{6\lambda}{\alpha^2}; \text{ or } \frac{8\lambda}{\alpha^2};$$

and/or less than or equal to:

$$\frac{10\lambda}{\alpha^2}; \text{ or } \frac{8\lambda}{\alpha^2}; \text{ or } \frac{6\lambda}{\alpha^2}; \text{ or } \frac{4\lambda}{\alpha^2}; \text{ or } \frac{2\lambda}{\alpha^2}.$$

Such values provide a good trade-off between the number of slices that can be obtained and the quality of the data that are obtained. Of course, other values can be used depending on the exact experimental scenario.

The methods disclosed herein can be combined with a conventional TFS experiment, employing larger than usual focus step sizes (which can thus reduce the total number of scans required). In one embodiment, a TFS is recorded with a segmented detector, and then the methods described herein are applied to each of the images of the TFS. Then, the in-focus slice from each reconstructed stack can be used to construct the best possible stack of objects, either directly or in an iterative process. For instance, when scans are performed for many different z-positions of the probe (to perform depth-sectioning), then the procedures described herein may be applied to each, and then used to optimize the outcome further (e.g. by picking the best in focus slice from each reconstructed stack). In general terms, there may be provided a method of obtaining a through-focus series (TFS) of a sample using a scanning transmission charged-particle microscopy (STCPM), the method comprising: performing a plurality of STCPM scans on the sample at a plurality of different respective focus depths to obtain a first TFS comprising a plurality (e.g. two or more than two) of first TFS image data sets; performing the methods described herein on each of the first TFS image data sets to obtain, for each first TFS image data set, at least one (preferably a plurality of) unknown object (for example, an in-focus slice) of the STCPM; and creating a second TFS comprising at least one (and preferably a plurality) of the unknown objects obtained from the first TFS image data set. Hence, an improved TFS can be obtained. The first TFS may be obtained using the same STCPM as described herein. The second TFS may be a new TFS that is constructed using the unknown objects obtained from analysing the first TFS.

Another advantage of some of the methods disclosed herein is that, as the result is based on a single STEM scan, there is no issue with aligning the different slices with respect to each other. In particular, in TFS, the alignment of the stack of images can be difficult. Thus, the methods described herein may be used to guide the alignment process for a TFS-STEM experiment. For example, a method may comprise: performing a first scan of a TFS; performing a second scan of a TFS; performing any of the methods described herein on at least one of the first and second scans; and comparing the results of applying any of the methods herein against data from the first scan and/or the second scan of the overlapping volume region. For example, this comparison may involve determining whether the theoretical slices correspond well with the actual scan(s). Based on such a comparison, it can be determined whether the first and second TFS scans are well-aligned. If the first and second TFS scans are not well-aligned, then re-alignment of the sample and/or other corrective action may be taken. This process may be automated (e.g. performed in software or by a controller of a STCPM) and/or controlled by a user.

Figure 5:
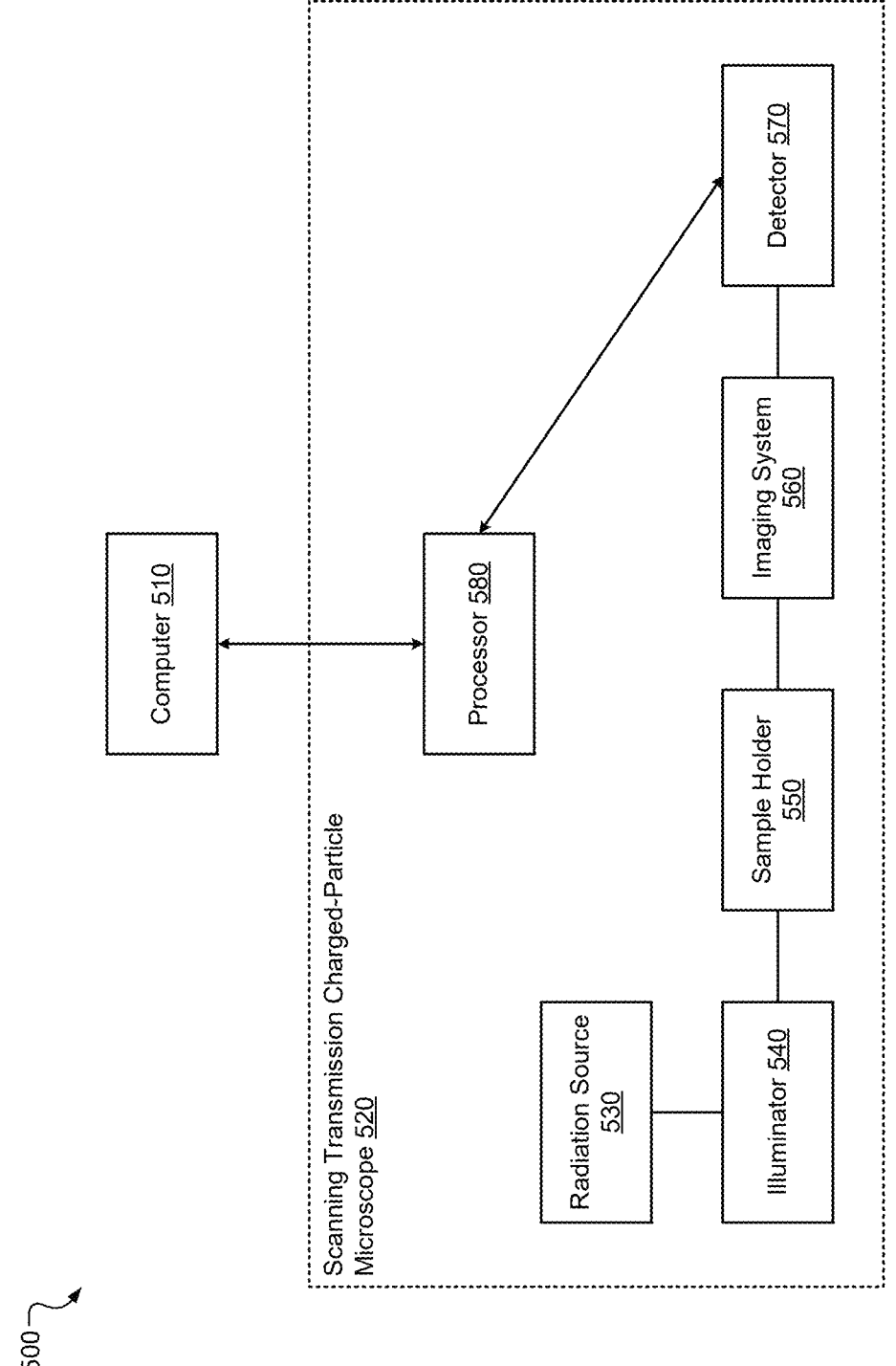
FIG. 5 shows schematically a system with which embodiments of the present disclosure can be implemented.

Turning next to FIG. 5, there is shown system 500 for performing the methods described herein. The system 500 comprises a computer 510 and a STCPM 520. The STCPM 520 is a single logical entity that comprises distinct subunits, which are encircled by a broken line in FIG. 5. In particular, the STCPM 520 comprises a processor 580 configured to cause the STCPM to perform the methods described herein on the image data provided by the STCPM 520. The remaining elements of the STCPM 520 are typical of known STCPMs. In particular, the STCPM 520 comprises: a radiation source 530 for providing charged particles; an illuminator 540, which manipulates the charged particles from the source 520; a sample holder 550, on which a sample under investigation can be held (and optionally moved to effect a scanning motion of the beam with respect to the sample); an imaging system 560, which takes charged particles that are transmitted through the sample (plane) and directs (focuses) the charged particles; and a detector 570, which is segmented and which produces image data when charged particles are incident thereon.

The system 500 can be used to implement any of the methods described herein. The system 500 is capable of performing a step of acquiring STCPM image data using the STCPM 520 and the system 500 is capable of performing any of the methods described herein on such acquired image data using the processor 580 (e.g. for local or online processing) and/or the computer 510 (e.g. for remote processing, which may be online, i.e. as an experiment runs, or fully offline, i.e. data analysis may be performed entirely separately from data collection).

In FIG. 5, arrows denote communication links. The processor 580 is in communication with the computer 510 and can transmit data to the computer 510 for analysis. The computer 510 can also transmit commands to the processor 580 to cause the processor to control operations of the STCPM 520. The processor is 520 in communication with each of the radiation source 530, the illuminator 540, the sample holder 550 (at least in the case where the position of the sample holder can be adjusted), the imaging system 560, and the detector 570. The processor 580 can transmit commands and/or receive data from each of the elements to which the processor 580 is connected. Each of the communication links may be wired or wireless communication links. Any type of communication that allows data transfer can be used. The processor 580 may have memory and/or the computer 510 may have memory. The memory (or memories) may comprise instructions that cause the processor 580 and/or the computer 510 to perform the functionality described herein. Some of the analytical methods described herein can be performed fully offline on a generic computing device, such as the computer 510.

In a general sense, the methods described herein may be executed as a computer program comprising program instructions that, when executed on a computer cause the computer to perform the method steps described herein. The computer may include desktop, laptop, server, embedded computers, integrated circuits, chips embedded in other devices or appliances, or other processors. The computer program may be stored as a computer-readable medium or as a signal. Also provided is a computer-readable medium comprising instructions that, when executed by a computer, cause the computer to carry out the methods described herein. Moreover, a computer-readable data carrier having stored thereon such a computer program is provided, as is a data carrier signal carrying such a computer program. Also provided is a data processing apparatus/system comprising a processor configured to perform the methods described herein.

It will be understood that many variations may be made to the above apparatus, systems and methods whilst retaining the advantages noted previously. For example, where specific components have been described, alternative components can be provided that provide the same or similar functionality.

The disclosure has been described primarily by reference to electron microscopy. However, it will be appreciated that other charged particles can be used in some embodiments.

The methods disclosed herein provide an alternative way to obtain the phase of the thin sample in addition to iDPC-STEM based on integration of the vector field to obtain scalar field (Lazić I, Bosch E G T, Lazar S, Ultramicroscopy, 2016; 160:265-280). This is achieved by making a reconstruction with only one slice, as already mentioned above. This also works for the case of a 4-segment detector.

In some embodiments, it may be advantageous to performing the STEM imaging with at least a certain sampling rate to reduce aliasing effects in the CTFs. For example, the sampling required to achieve this may be quantified in several ways. In one case, if the field of view (horizontal field width) is FOV, the number of pixels is N, the maximum frequency that can be represented may be approximated to $k_{max}=N/(2*FOV)$. By setting this frequency to be larger than or equal to $$2k_{BF} = 2\frac{\alpha}{\lambda}$$

as this is the maximum frequency for which any of the CTFs is non-zero, a sampling rate may therefore preferably be finer than $$\frac{4\alpha FOV}{\lambda}.$$

An alternative way of determining a sampling rate may be to: 1) reconstruct only the part of the frequency space that is not suffering from aliasing; and 2) generate CTFs on a larger grid so that aliasing is prevented.

Thus, in some implementations, it may be advantageous to solve the system of equations to obtain only a single unknown object of the STCPM. Therefore, while embodiments of the disclosure allow for general imaging in 3D (e.g. for a thick sample) volume, a mono-slice example (e.g. back to simple 2D imaging of thin sample) method is also provided. For instance, the disclosure also provides a computer-implemented method of processing image data, the method comprising: receiving the image data, wherein the image data is scanning transmission charged-particle microscope (STCPM) image data representing a STCPM scan obtained at a first focus depth; and processing a system of equations expressing the image data as a sum of contributions from at least one slice of the sample at a respective focus depth, wherein each equation of the system of equations relates at least a portion of the image data to: at least one of a plurality of contrast transfer functions of the STCPM, each contrast transfer function of the STCPM being determined at a respective focus depth; and at least one set of unknown objects of the STCPM, each unknown object in a set being at a respective focus depth; wherein the step of processing comprises solving the system of equations to obtain at least one of the plurality of unknown objects of the STCPM. This method can be used with the other optional features described previously in exactly the same way as the system of equations derived previously.

It will be appreciated that embodiments of the disclosure may be implemented using a variety of different information processing systems. In particular, although the figures and the discussion thereof provide exemplary computing systems and methods, these are presented merely to provide a useful reference in discussing various aspects of the disclosure. Some embodiments may be carried out on any suitable data processing device, such as a personal computer, laptop, personal digital assistant, mobile telephone, server computer, etc. Of course, the description of the systems and methods has been simplified for purposes of discussion, and they are just one of many different types of systems and methods that may be used. It will be appreciated that the boundaries between logic blocks are merely illustrative and that alternative embodiments may merge logic blocks or elements, or may impose an alternate decomposition of functionality upon various logic blocks or elements.

The above-mentioned functionality may be implemented as one or more corresponding modules as hardware and/or software. For example, the above-mentioned functionality may be implemented as one or more software components for execution by a processor of the system. Alternatively, the above-mentioned functionality may be implemented as hardware, such as on one or more field-programmable-gate-arrays (FPGAs), and/or one or more application-specific-integrated-circuits (ASICs), and/or one or more digital-signal-processors (DSPs), and/or other hardware arrangements. Method steps implemented in flowcharts contained herein, or as described above, may each be implemented by corresponding respective modules. Moreover, multiple method steps implemented in flowcharts contained herein, or as described above, may be implemented together by a single module.

It will be appreciated that, insofar as embodiments of the disclosure are implemented by a computer program, then a storage medium and a transmission medium carrying the computer program form aspects of the disclosure. The computer program may have one or more program instructions, or program code, that, when executed by a computer, causes an embodiment of the disclosure to be carried out. The term "program" as used herein, may be a sequence of instructions designed for execution on a computer system, and may include a subroutine, a function, a procedure, a module, an object method, an object implementation, an executable application, an applet, a servlet, source code, object code, a shared library, a dynamic linked library, and/or other sequences of instructions designed for execution on a computer system. The storage medium may be a magnetic disc (such as a hard drive or a floppy disc), an optical disc (such as a CD-ROM, a DVD-ROM or a BluRay disc), or a memory (such as a ROM, a RAM, EEPROM, EPROM, Flash memory or a portable/removable memory device), etc. The transmission medium may be a communications signal, a data broadcast, a communications link (e.g.

a wired communications link and/or a wireless communications link) between two or more computers, etc.

Each feature disclosed in this specification, unless stated otherwise, may be replaced by alternative features serving the same, equivalent or similar purpose. Thus, unless stated otherwise, each feature disclosed is one example only of a generic series of equivalent or similar features.

As used herein, including in the claims, unless the context indicates otherwise, singular forms of the terms herein are to be construed as including the plural form and, where the context allows, vice versa. For instance, unless the context indicates otherwise, a singular reference herein including in the claims, such as "a" or "an" (such as a contrast function or an object) means "one or more" (for instance, one or more contrast transfer functions, or one or more objects). Throughout the description and claims of this disclosure, the words "comprise", "including", "having" and "contain" and variations of the words, for example "comprising" and "comprises" or similar, mean that the described feature includes the additional features that follow, and are not intended to (and do not) exclude the presence of other components.

The use of any and all examples, or exemplary language ("for instance", "such as", "for example" and like language) provided herein, is intended merely to better illustrate the disclosure and does not indicate a limitation on the scope of the disclosure unless otherwise claimed. No language in the specification should be construed as indicating any non-claimed element as essential to the practice of the disclosure.

Any steps described in this specification may be performed in any order or simultaneously unless stated or the context requires otherwise. Moreover, where a step is described as being performed after a step, this does not preclude intervening steps being performed.

All of the aspects and/or features disclosed in this specification may be combined in any combination, except combinations where at least some of such features and/or steps are mutually exclusive. In particular, the preferred features of the disclosure are applicable to all aspects and embodiments of the disclosure and may be used in any combination. Likewise, features described in non-essential combinations may be used separately (not in combination).

A method of manufacturing and/or operating any of the apparatus disclosed herein is also provided. The method may comprise steps of providing each of the features disclosed and/or configuring or using the respective feature for its stated function.

The invention claimed is:

1. A computer-implemented method of processing image data, the method comprising:

receiving the image data, wherein the image data is scanning transmission charged-particle microscope (STCPM) image data representing a STCPM scan obtained at a first focus depth;

processing a system of equations expressing the image data as a sum of contributions from a plurality of virtual slices of a sample at a plurality of focus depths, wherein each equation of the system of equations relates at least a portion of the image data to: at least one of a plurality of contrast transfer functions of the STCPM, each contrast transfer function of the STCPM being determined at a different respective focus depth from the first focus depth; and at least one set of representations of unknown structures of the STCPM, each unknown structure in a set being at a different respective focus depth from the first focus depth;

wherein the step of processing comprises solving the system of equations to obtain at least one of the plurality of representations of the unknown structures of the STCPM; and generating, from the obtained representations, reconstructed image data respectively corresponding to the plurality of virtual slices of the sample at the plurality of focus depths.

2. The method of claim 1, wherein the step of processing comprises solving the system of equations to obtain the plurality of image data representing unknown structures of the STCPM at different focus depths.

3. The method of claim 1, wherein the step of processing comprises solving the system of equations by singular value decomposition (SVD).

4. The method of claim 1, wherein the step of processing comprises regularising the system of equations before solving the system of equations.

5. The method of claim 1, wherein:

one of the sets of representations of unknown structures comprises $\sin \varphi_n(r_p)$ and/or one of the sets of representations of unknown structures comprises $1-\cos \varphi_n(r_p)$;

where $r_p$ represents a scan position of the image data and $\varphi_n$ represents a phase shift induced by an n-th virtual slice of the plurality of virtual slices of the sample.

6. The method of claim 1, wherein the system of equations is of the form $A\underline{u}=\underline{v}$, where A is a matrix representing the plurality of contrast transfer functions of the STCPM, $\underline{u}$ is a vector representing the at least one set of representations of unknown structures of the STCPM, and $\underline{v}$ is a vector representing the image data.

7. The method of claim 6, wherein the system of equations satisfies at least one of conditions (i), (ii) and/or (iii):

$$ (i) $$

$$ A = $$

$$ \begin{pmatrix} CTF_{S,0,0} & CTF_{C,0,0} & CTF_{S,0,1} & CTF_{C,0,1} & \cdots & CTF_{S,0,N} & CTF_{C,0,N} \\ CTF_{S,1,0} & CTF_{C,1,0} & CTF_{S,1,1} & CTF_{C,1,1} & \cdots & CTF_{S,1,N} & CTF_{C,1,N} \\ \vdots & \vdots & \vdots & \vdots & \ddots & \vdots & \vdots \\ CTF_{S,M,0} & CTF_{C,M,0} & CTF_{S,M,1} & CTF_{C,M,1} & \cdots & CTF_{S,M,N} & CTF_{C,M,N} \end{pmatrix} $$

where $CTF_{S/C,M,N}$ are contrast transfer functions of the STCPM for the representations $\sin \varphi_n(r_p)$ and $1-\cos \varphi_n(r_p)$ respectively and where $r_p$ represents a scan position of the image data, wherein the plurality of virtual slices comprises N virtual slices and the image data is segmented STCPM image data from a STCPM detector having M segments;

$$ (ii) $$

$$ \underline{u} = \begin{pmatrix} \mathcal{F}\{\sin\varphi_0\} \\ \mathcal{F}\{1-\cos\varphi_0\} \\ \mathcal{F}\{\sin\varphi_1\} \\ \mathcal{F}\{1-\cos\varphi_1\} \\ \vdots \\ \mathcal{F}\{\sin\varphi_N\} \\ \mathcal{F}\{1-\cos\varphi_N\} \end{pmatrix} $$

where $\mathcal{F}\{\sin \varphi_N\}$ and $\mathcal{F}\{1-\cos \varphi_N\}$ for n=0, 1, . . . , N are components of Fourier transforms of the representations $\sin \varphi_n(r_p)$ and $1-\cos \varphi_n(r_p)$, where $r_p$ represents a scan position of the image data and wherein the plurality of virtual slices comprises N virtual slices; and/or $$\underline{v} = \begin{pmatrix} \mathcal{F}\{I_0^{STEM}\} \\ \mathcal{F}\{I_1^{STEM}\} \\ \vdots \\ \mathcal{F}\{I_M^{STEM}\} \end{pmatrix} \qquad \text{(iii)}$$

where $$\mathcal{F}\{I_M^{STEM}\},$$

for s=0,1, . . . , M, are components of Fourier transforms of the image data, wherein the image data is segmented STCPM image data from a STCPM detector having M segments.

8. The method of claim 1, wherein solving the system of equations comprises obtaining components of Fourier transforms of at least one of the plurality of representations of unknown structures of the STCPM and obtaining the at least one of the plurality of representations of unknown structures of the STCPM by inverse Fourier transformation.

9. The method of claim 1, wherein solving the system of equations comprises solving the system of equations for each of a plurality of k-vectors of a Fourier transform of the image data.

10. The method of claim 1, wherein the image data is segmented STCPM image data.

11. The method of claim 1, wherein:
the plurality of virtual slices comprises N virtual slices and the image data is segmented STCPM image data from a STCPM detector having M segments, wherein NM
$N << 0.5MN < 0.5MN < 0.4MN < 0.3MN < 0.2MN < 0.1MN < 0.05MN < 0.01M$
a ratio of N/M has a value in a range from greater than 0 to less than 0.5.

12. The method of claim 1, wherein $\lambda$ is the wavelength of charged particles of the STCPM and $\alpha$ is a beam opening angle of the STCPM, wherein the focus depths of the plurality of virtual slices differ by a distance of:
greater than or equal to a value between $$\frac{\lambda}{\alpha^2} \frac{2\lambda}{\alpha^2} \frac{4\lambda}{\alpha^2} \frac{6\lambda}{\alpha^2}$$

and $$\frac{8\lambda}{\alpha^2};$$

and/or, $$\frac{10\lambda}{\alpha^2} \frac{8\lambda}{\alpha^2} \frac{6\lambda}{\alpha^2} \frac{4\lambda}{\alpha^2} \frac{2\lambda}{\alpha^2}.$$

13. The method of claim 1, further comprising determining one or more parameters of at least one of the plurality of contrast transfer functions of the STCPM by iteratively adjusting the one or more parameters, with respect to a quality criterion, on at least one of the plurality of representations of unknown structures of the STCPM.

14. The method of claim 1, wherein:
the plurality of virtual slices comprises N virtual slices and N is greater than a value in a range of between 2 and 10.

15. The method of claim 1, wherein $\lambda$ is the wavelength of charged particles of the STCPM and $\alpha$ is a beam opening angle of the STCPM, wherein the focus depths of the plurality of slices differ by a distance of:
less than or equal to a value in a range of between $$\frac{10\lambda}{\alpha^2} \text{ and } \frac{2\lambda}{\alpha^2}.$$

16. A method of obtaining a through-focus series (TFS) of a sample using a scanning transmission charged-particle microscopy (STCPM), the method comprising:
performing a plurality of STCPM scans on the sample at a plurality of different respective focus depths to obtain a first TFS comprising a plurality of first TFS image data sets;
performing the method of any preceding claim on each of the first TFS image data sets to obtain, for each first TFS image data set, at least one representation of an unknown structure of the STCPM; and
generating a second TFS comprising, for each first TFS image data set, reconstructed image data generated from the at least one representation of the unknown structure.

17. A scanning transmission charged-particle microscope (STCPM) comprising:
a charged-particle source;
particle optics configured to direct charged particles from the charged-particle source towards a sample to cause the charged particles to pass through the sample;
a detector configured to detect charged particles passing through the sample to provide image data; and
a processor configured to cause the STCPM to:
receive the image data, wherein the image data is scanning transmission charged-particle microscope (STCPM) image data representing a STCPM scan obtained at a first focus depth;
process a system of equations expressing the image data as a sum of contributions from a plurality of virtual slices of the sample at a plurality of focus depths, wherein each equation of the system of equations relates at least a portion of the image data to: at least one of a plurality of contrast transfer functions of the STCPM, each contrast transfer function of the STCPM being determined at a different respective focus depth from the first focus depth; and at least one set of representations of unknown structures of the STCPM, each unknown structure in a set being at a different respective focus depth from the first focus depth;
wherein at least one of the plurality of representations of the unknown structures of the STCPM is obtained through solving the system of equations; and
generate, from the obtained representations, reconstructed image data respectively corresponding to the plurality of virtual slices of the sample at the plurality of focus depths.

\* \* \* \* \*